United States Patent
Finke et al.

(10) Patent No.: US 8,618,789 B2
(45) Date of Patent: Dec. 31, 2013

(54) METHOD AND APPARATUS OF OFFSET ERROR COMPENSATION FOR CURRENT MEASUREMENT IN PHASE LINES OF A MULTIPHASE CURRENT NETWORK

(75) Inventors: Sven Finke, Gerlingen (DE); Timo Kuehn, Karlsbad (DE)

(73) Assignee: Robert Bosch GmbH, Stuttgart (DE)

( * ) Notice: Subject to any disclaimer, the term of this patent is extended or adjusted under 35 U.S.C. 154(b) by 496 days.

(21) Appl. No.: 12/936,840

(22) PCT Filed: Feb. 12, 2009

(86) PCT No.: PCT/EP2009/051610
§ 371 (c)(1),
(2), (4) Date: Nov. 5, 2010

(87) PCT Pub. No.: WO2009/124798
PCT Pub. Date: Oct. 15, 2009

(65) Prior Publication Data
US 2011/0057641 A1    Mar. 10, 2011

(30) Foreign Application Priority Data
Apr. 7, 2008   (DE) .................... 10 2008 001 025

(51) Int. Cl.
*G01R 31/00*   (2006.01)

(52) U.S. Cl.
USPC .................... 324/76.12; 324/500; 324/142

(58) Field of Classification Search
None
See application file for complete search history.

(56) References Cited

U.S. PATENT DOCUMENTS

| 5,309,349 A | 5/1994 | Kwan |
| 5,635,809 A * | 6/1997 | Ganser et al. ................. 318/650 |
| 5,708,343 A * | 1/1998 | Hara et al. .................... 318/599 |
| 6,335,600 B1 * | 1/2002 | Kasai et al. ................... 318/434 |
| 7,193,382 B2 * | 3/2007 | Jeon ............................. 318/434 |
| 2003/0006749 A1 | 1/2003 | Rollman |
| 2003/0173946 A1 | 9/2003 | Liu et al. |
| 2006/0001392 A1* | 1/2006 | Ajima et al. .................. 318/432 |
| 2008/0079385 A1* | 4/2008 | Hashimoto et al. ........... 318/801 |

FOREIGN PATENT DOCUMENTS

| DE | 102005062759 A1 | 7/2007 |
| EP | 1347567 A1 | 9/2003 |
| JP | 6-153526 A | 5/1994 |
| JP | 2002-257869 A | 9/2002 |
| JP | 2004-264298 A * | 9/2004 |
| JP | 2004-264298 A | 9/2004 |
| JP | 2005-531270 A | 10/2005 |
| WO | 03/032478 A1 | 4/2003 |

* cited by examiner

*Primary Examiner* — Vinh Nguyen
(74) *Attorney, Agent, or Firm* — Maginot, Moore & Beck

(57) ABSTRACT

In a method for current measurement in a multiphase current network, a conductive connection is produced between a plurality of the phases of the multiphase current network such that the plurality of the phases is short-circuited with one another. At a detection time, a current value flowing between the conductive connection and a first voltage potential is detected.

6 Claims, 4 Drawing Sheets

METHOD AND APPARATUS OF OFFSET ERROR COMPENSATION FOR CURRENT MEASUREMENT IN PHASE LINES OF A MULTIPHASE CURRENT NETWORK

CROSS-REFERENCE TO RELATED APPLICATION

This application is a 35 USC 371 application of PCT/EP2009/051610 filed on Feb. 12, 2009.

BACKGROUND OF THE INVENTION

1. Field of the Invention

The invention relates to a method for current measurement in a multiphase current network in particular.

2. Description of the Prior Art

A multiphase current network is used for instance to supply current to an electric motor. A current flowing in one phase of the multiphase current network can be measured by means of a low-impedance resistor (shunt). In so-called 1-shunt current measurement, the currents in the individual phases can be ascertained via a single shunt. However, measurement inaccuracies caused by offsets can occur.

OBJECT AND SUMMARY OF THE INVENTION

It is the object of the invention to make improved current measurement possible.

The present invention enables automatic measurement error compensation, which can be used for instance in a 1-shunt current measurement. The approach according to the invention is based on a definition of sampling times for ascertaining offset errors that occur. In the 1-shunt current measurement, two measurement errors caused by offsets can occur. These are an operational amplifier offset and a ripple offset, which can have its source in the phase voltage output by means of asymmetrical pulse width modulation (PWM) with phase shifting. According to the approach taken by the invention, it is no longer necessary for these offset errors to be ascertained by means of a band end calibration and stored in memory, for instance in a EEPROM of a control unit. By dispensing with the band end calibration, a cost saving is achieved. The offset components described are not constant at all operating points. Moreover, they are subject to certain aging effects. These effects can be taken into account according to the invention, so that the quality of the current measurement can be improved. Advantageously, the approach according to the invention can be combined with known measuring methods. Alternatively, the approach according to the invention can also be used on its own.

In one embodiment, the present invention creates a method for current measurement in a multiphase current network, which has the following steps:
  making a conductive connection between a plurality of the phases of the multiphase current network, so that the plurality of the phases are short-circuited to one another; and
  detecting a current value, flowing between the conductive connection and a first voltage potential at a detection time.

Detecting the current value can be done by means of a measuring device, which is disposed between the conductive connection and the first voltage potential. This makes the use of a shunt possible, for instance.

The plurality of phases can be connected to the measuring device via at least one first switch, and the at least one first switch can be closed at the detection time. Thus the method is suitable for use in a 1-shunt current measurement.

Moreover, each of the plurality of phases can be connected to the measuring device via a respective first switch, and all the first switches can be closed at the detection time. Such an arrangement can be used in conjunction with a bridge circuit, with which a multiphase consumer can be triggered.

Between a closure of a final first switch and the detection time, there can be a predetermined minimum duration. As a result, it can be ensured that the measuring device employed has reached a steady state.

The plurality of phases can be connected to a second voltage potential via at least one second switch. This makes it possible to incorporate a multiphase consumer into a direct voltage current circuit.

Moreover, the conductive connection can be made between all the phases of the multiphase current network.

In one embodiment, the current value can enable compensating for a zero shift of the measuring device.

In a further embodiment, the present invention creates a method for current measurement in a multiphase current network, which has the following steps:
  detecting a first current value, flowing between a first phase of the multiphase current network and a first voltage potential at a first detection time;
  detecting a second current value, flowing between the first phase and the first voltage potential, at a second detection time, and the first and second detection times are selected such that the first and second current values have different signs; and
  ascertaining a current value from the first and second current values.

The detection of the first and second current values can be done by means of a measuring device, which is disposed between the first voltage potential and a plurality of first switches, and each phase of the multiphase current network is connected to the measuring device via a respective one of the plurality of first switches. Thus the method is suitable for use in a 1-shunt current measurement.

At the first detection time, only one first switch, associated with the first phase, can be closed, and at the second detection time, only the first switch associated with the first phase can be opened. This switching pattern makes it possible to ascertain a value for an offset error compensation of the current measurement.

The first detection time can be separated by an interval of a first predetermined duration from a first switching event of the first switch, associated with the first phase, and the second detection time can be separated by an interval of a second predetermined duration from a second switching event of the first switch associated with the first phase. Thus it can be attained that the currents detected at the first and second detection times are symmetrical to one another.

For instance, the predetermined duration can correspond to the second predetermined duration. Hence there is an identical time interval between the detection times and the respective associated switching events.

The current value can also be ascertained as a mean value from the first and second current values.

In this embodiment, a value corresponding to the second current value can be furnished from a memory, if it is not possible to detect the second current value at the second detection time.

Moreover, each phase of the multiphase current network can be connectable via a respective second switch to the second voltage potential, and at the first detection time, only a second switch of the first phase is opened, and at the second detection time, only the second switch of the first phase is closed. Thus the method can be used in a bridge circuit for triggering a multiphase consumer.

In a further embodiment, the present invention creates an apparatus for current measurement in a multiphase current network, having the following characteristics:
- a plurality of first switches for making a conductive connection between a plurality of the phases of the multiphase current network, so that the plurality of phases are short-circuited to one another;
- a control device for triggering the plurality of first switches; and a measuring device between the conductive connection and the first voltage potential for detecting a current value, flowing between the conductive connection and a first voltage potential, at a detection time.

The measuring device can be embodied in particular as a measuring resistor and disposed between the conductive connection and the first voltage potential.

The plurality of phases can be connected to the measuring device via at least one of the plurality of first switches, and the control device can be embodied for triggering the plurality of first switches such that the at least one first switch is closed at the detection time.

Each of the plurality of phases can be connected to the measuring device via a respective one of the plurality of first switches, and the control device can be embodied for triggering the plurality of first switches such that all the first switches are closed at the detection time.

The control device can be embodied for triggering the plurality of first switches such that between a closure of a final first switch and the detection time, there is a predetermined minimum duration.

The apparatus can have at least one second switch, and the plurality of phases are connected to a second voltage potential via the at least one second switch.

In a further embodiment, the present invention creates an apparatus for current measurement in a multiphase current network, having the following characteristics:
- a measuring device, which is embodied for detecting a first current value, flowing between a first phase of the multiphase current network and a first voltage potential, at a first detection time and for detecting a second current value, flowing between the first phase and the first voltage potential, at a second detection time, and the first and second detection times are selected such that the first and second current values have different signs; and
- a device for ascertaining a current value from the first and second current values.

The apparatus can have a plurality of first switches, and the measuring device is disposed between the first voltage potential and the plurality of first switches, and each phase of the multiphase current network is connected to the measuring device via a respective one of the plurality of first switches.

It is possible for only a first switch associated with the first phase to be closed at the first detection time and opened at the second detection time.

The first detection time can be separated by an interval of a first predetermined duration from a first switching event of the first switch, associated with the first phase, and the second detection time can be separated by an interval of a second predetermined duration from a second switching event of the first switch associated with the first phase. The first predetermined duration can correspond to the second predetermined duration.

The apparatus can have a memory, which is embodied for furnishing a value corresponding to the second current value, if detecting the second current value at the second detection time is not possible.

The apparatus can have a plurality of second switches, which are disposed such that each phase of the multiphase current network is connectable, via a respective one of the plurality of the second switches, to a second voltage potential, and only a second switch associated with the first phase is opened at the first detection time and closed at the second detection time.

BRIEF DESCRIPTION OF THE DRAWINGS

The invention will be described in detail below in conjunction with the accompanying drawings, in which.

DESCRIPTION OF THE PREFERRED EMBODIMENTS

Figure 1:
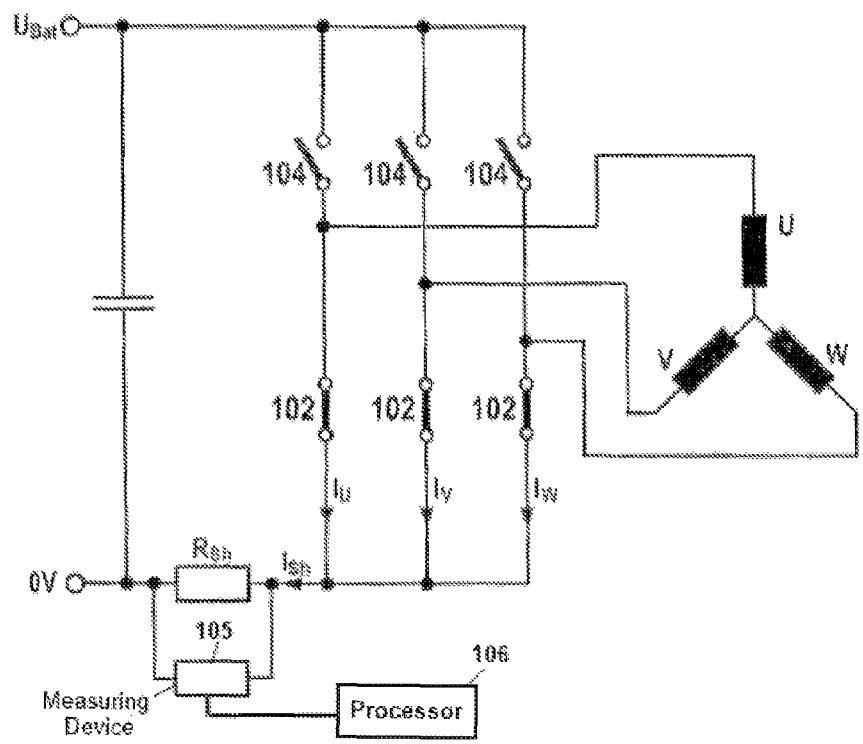
FIG. 1; depicts a multiphase current network.

FIG. 1 shows a multiphase current network with a bridge circuit, in one exemplary embodiment of the present invention. The bridge circuit has three bridge branches. Each bridge branch has a first switch 102 and a second switch 104. The bridge circuit is embodied for triggering a three-phase consumer. For that purpose, a first bridge branch is connected to a first phase U of the consumer, a second bridge branch is connected to a second phase, and a third bridge branch is connected to a third phase. The consumer can be embodied as a three-phase asynchronous motor. The first switches 102 and the second switches 104 can be triggered by a control unit, not shown.

The bridge circuit is connected to a direct current circuit, which can be embodied as an intermediate current circuit. To that end, a first terminal of the bridge circuit is connected to a first voltage potential 0V via a resistor $R_{Sh}$, which can be embodied as a shunt. A second terminal of the bridge circuit is connected to a second voltage potential $U_{Bat}$. A capacitor is connected between the first and second terminals of the bridge circuit.

Phase currents IU, IV, IW flowing via the first switches 102 combine at a node point to form a current $I_{Sh}$, which flows through the resistor $R_{Sh}$. The resistor $R_{Sh}$ can be part of a measuring device, such as measuring device 105 in FIG. 1, which is embodied for detecting the current $I_{Sh}$. The measuring device can have a measurement amplifier circuit and an analog/digital converter, which converts the analog signal of the resistor $R_{sh}$ into a digital signal. The measurement amplifier circuit can have a transient time. The analog/digital converter can have a sampling time, and the switches 102, 104, which can be embodied as field effect transistors (FETs), can have an idle time. These times should be taken into account in the measurement, by way of the resistor $R_{sh}$. The digital signals from the measuring device 105 are output to a processing device, such as processor 106 depicted FIG. 1. The processing device is configured to process the measured current values received from the measuring device to ascertain and/or compensate for offset errors using the current measurement values.

For instance, with the resistor $R_{Sh}$, the phase current $I_U$, $I_V$, $I_W$ can be ascertained in sequential order. To that end, two of the total of three phase currents $I_U$, $I_V$, $I_W$ are measured, and the third phase current is calculated using Kirchhoff's laws. For measuring the phase currents $I_U$, $I_V$, $I_W$, a certain switching pattern, that is, a certain triggering of the switches 102, 104, may be necessary so that the current through the resistor $R_{Sh}$ corresponds to the phase current $I_U$, $I_V$, $I_W$ to be measured.

For triggering the switches 102, 104, a clocking pattern can be selected, in which switching times of the switches 102, 104 are chronologically shifted, so that the measurement of at least two of the three phase currents $I_U$, $I_V$, $I_W$ can be done within one pulse width modulation period. For instance, at the time of a first measurement, the current through the resistor $R_{Sh}$ can correspond to the current in the phase U, and at the time of the second measurement, it can correspond to the inverse current in the phase W, which is equivalent to adding together the phase currents U and V. The measurements can be performed in one of two subperiods A, B of the pulse width modulation period. The sum of the subperiods A, B is the pulse width modulation period.

In one exemplary embodiment of the present invention, an offset error of the measurement amplifier circuit can be compensated for with the resistor $R_{Sh}$.

Since the measurement range of the current measurement is intended to have a positive and a negative range, it is necessary to prestress the input of the amplifier circuit to a medium potential. To that end, with the aid of a resistor voltage divider, the input of the operational amplifier (OPV) of the measurement amplifier circuit can be applied to medium voltage. This resistor voltage divider can be calibrated with the aid of lasers in the production for instance of an associated control unit (ECU) and is thus highly precise. A change in the resistances via the temperature, however, cannot be prevented. This can lead to worsening of the medium voltage and thus of the zero point of the current measurement. Moreover, a temperature drift of the operational amplifier itself can also occur. Thus both effects can lead to a temperature-dependent offset failure in the current measurement.

The approach according to the invention makes automatic compensation for the operational amplifier offset possible.

As shown in FIG. 1, the shunt $R_{Sh}$, for current measurement, is in the connection with the intermediate circuit. This corresponds to the construction of a 1-shunt current measurement. Thus compared to a construction with a 3-shunt current measurement, the advantage is obtained that only the intermediate circuit current has to become zero. Thus there is independence from the phase currents $I_U$, $I_V$, $I_W$, and it is not absolutely necessary to have the output moment change to zero. In accordance with the approach of the present invention, a switching pattern is looked for in which it is possible to ascertain the offset value of the operational amplifier circuit. Such a switching pattern exists when all the low-side switches 102 or all the high-side switches 104 are ON.

One such switching pattern for ascertaining the operational amplifier offset is shown in FIG. 1. In this exemplary embodiment, the three-phase consumer is embodied as a motor, and the switches 102, 104 are embodied as FETs. In the switching pattern shown in FIG. 1, all three motor phases U, V, W are short-circuited via the low-side FETs, so that the intermediate circuit current and consequently the current through the shunt $R_{Sh}$ as well become zero. According to the invention, at that time, the voltage across the shunt $R_{Sh}$ is sampled. As a result, a value of the zero shift of the current measurement can be obtained, with the aid of which the compensation for the offset error can be done by subtraction. In doing so, care should be taken that before the sampling, the switching pattern is output long enough that a steady-state value is present at the input of the analog/digital converter of the measurement circuit. This requirement, for an operational amplifier offset, means that at the end of the half-period A, a zero-voltage vector will be output until such time as the current measurement amplifier is in a steady state.

Thus the result is an upper pulse width modulation limit for the individual phases U, V, W, below which the operational amplifier offset measurement is possible. This limit value is dependent on the phase shift of the corresponding phase. In principle, the following is true:

$$\text{PWM}_{max} = (T_{PWM} - T_{phaseshift} - t_x)/T_{PWM} \tag{1}$$

$\text{PWM}_{max}$ represents the upper pulse width modulation limit of the applicable phase U, V, W; $T_{PWM}$ stands for the period length of the pulse width modulation, and the times $T_{setlinkOPV}$, $T_{phaseshift}$ and $T_{sample}$ reflect the transient time of the operational amplifier, the phase shift, and the sampling time. The time $t_x$ is found from the following equation:

$$t_x = \text{idle time} + \text{transient time OPV} + \text{sampling time.}$$

Figure 2:
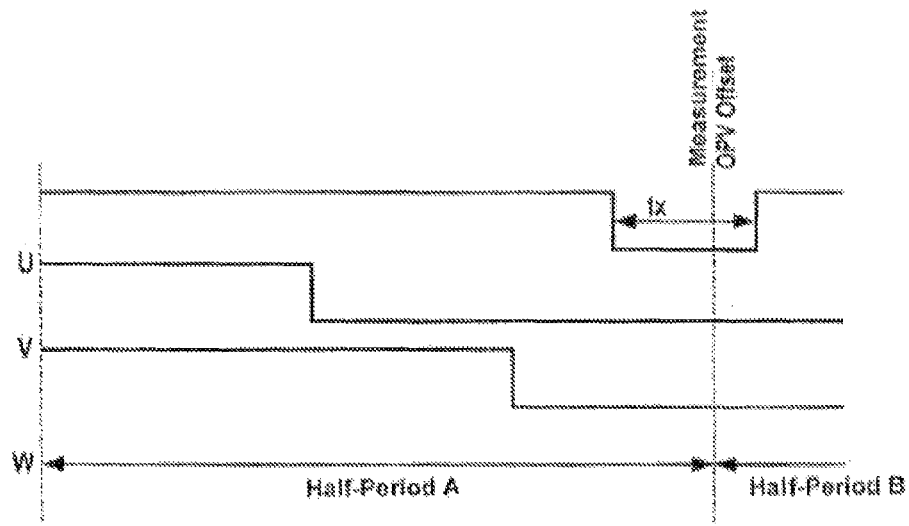
FIG. 2 shows a first switching pattern.

FIG. 2 is a graph showing a maximum pulse width modulation in which measurement of the operational amplifier offset is possible. The sampling patterns in the phases U, V, W in the half-period A and the half-period B are shown. The transitions in the phases U, V, W are attained by switching over the switches 102, 104 shown in FIG. 1. The measurement of the operational amplifier offset is done here at the transition from the half-period A to the half-period B, within the time slot $t_x$.

In a further approach of the present invention, compensation for an offset error from current waviness is possible.

Because of the outputting of different voltage vectors during the subperiods B and A, in an asymmetrical pulse width modulation with phase shifting, waviness of the current occurs. This waviness will hereinafter also be called ripple. This current ripple has the same frequency as the pulse width modulation. Since the two currents required for a current measurement are determined at different sampling times, this current ripple leads to an offset error in the current measurement.

Figure 3:
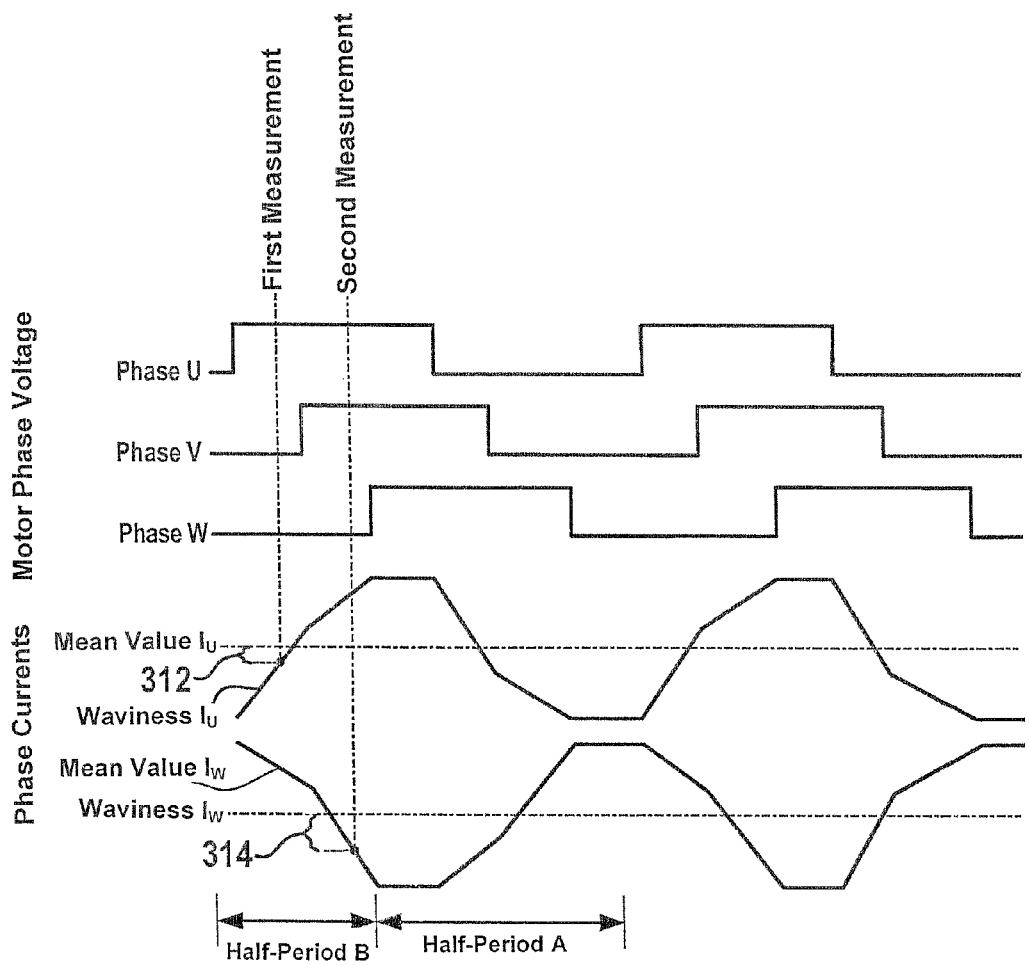
FIG. 3 shows a second switching pattern.

FIG. 3 shows the offset error in asymmetrical pulse width modulation with phase shifting, and in particular shows how the offset error occurs from current waviness. Two pulse width modulation periods with corresponding current ripple are shown.

In the upper graph of FIG. 3, the courses of the motor voltage in the phases U, V, W are shown. In the lower graph, the courses of the phase currents $I_U$, $I_W$ are shown. The mean value and the waviness are shown for the phase currents $I_U$, $I_W$. Both the first measurement and the second measurement are done in the half-period B, which is followed by the half-period A. With the first measurement, the phase current $I_U$ is measured. The offset error 312 with respect to the phase current $I_U$ is shown at the time of the first measurement as an interval between the mean value and the waviness of the phase current $I_U$.

The current measurement error from the asymmetrical pulse width modulation with phase shifting is dependent on the battery voltage $U_{Bat}$, the ohmic resistors $R_{FET}$ and $R_{Motor}$, the motor inductances $L_{Motor}$, and the time t between the input jump and the measurement time.

The ohmic resistors $R_{FET}$ and $R_{Motor}$ and the motor inductance $L_{Motor}$ are in turn influenced by the temperature. In the case of the inductance, the influence of the magnetic flux in the machine or the saturation of the iron is a further factor.

In contrast to the compensation for the temperature offset, in the compensation for the ripple offset, recourse cannot be had to existing methods in 3-shunt current measurement and thus to center-centered pulse width modulation, in which the current values are sampled not serially but parallel, and the measurement time is selected such that the currents are ascertained at the zero crossover of this waviness and thus no offset error occurs.

In this exemplary embodiment, compensation for the offset from current waviness is done by means of double sampling.

One possibility for compensating for the current ripple error is afforded by the symmetry of the waviness. This can be utilized by resampling the current value in the negative half-wave and averaging the two values. To that end, the measurement shown in FIG. 3 is expanded by a second measurement for both currents $I_U$, $I_W$ in the half-period A.

Figure 4:
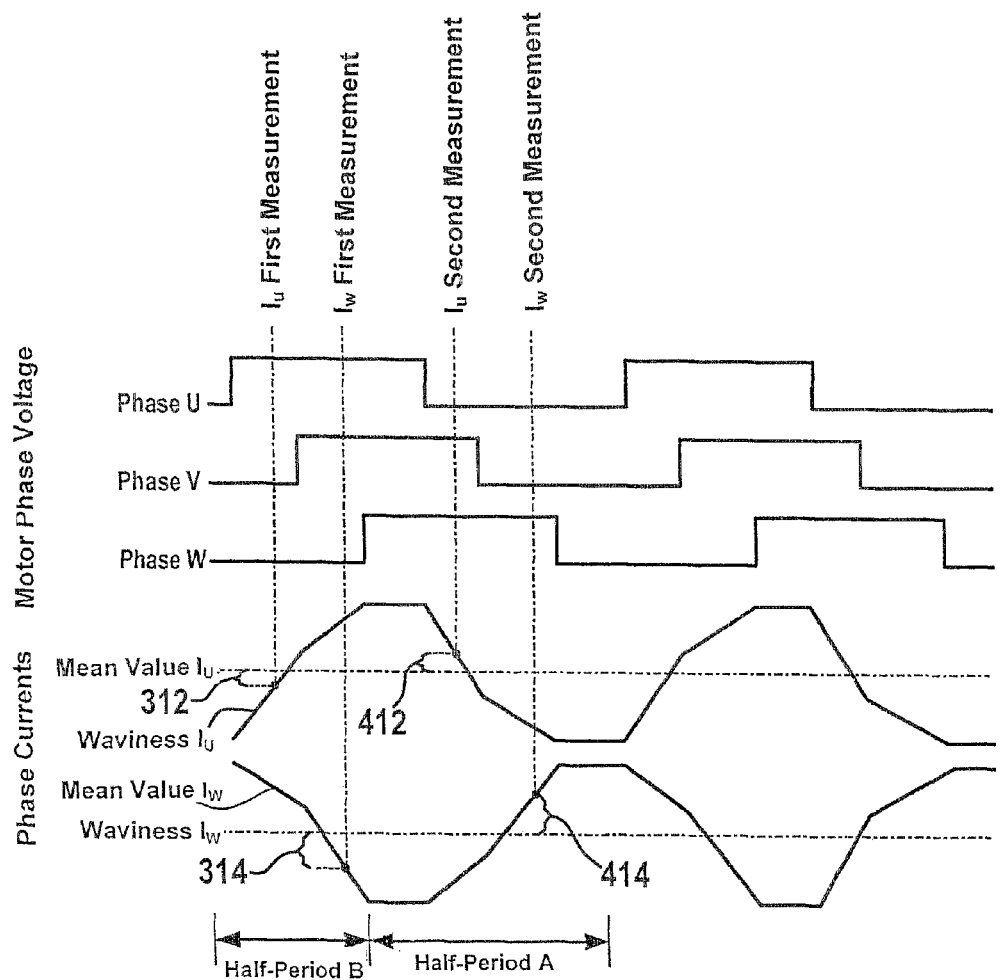
FIG. 4 shows a third switching pattern.

FIG. 4 shows the course of current measurement with automatic ripple offset compensation by double sampling, in one exemplary embodiment of the present invention. Besides the measurements already shown in FIG. 3, "$I_u$ first measurement" and "$I_w$ first measurement", two further measurements are shown in FIG. 4, "$I_u$ second measurement" and "$I_w$ second measurement", which are performed in the half-period A. Corresponding offset errors 412, 414 are shown for the phase currents $I_U$, $I_W$ at the respective times of the second measurements.

In this exemplary embodiment, the times of the second measurements are of decisive significance. They must take place at exactly the same interval for switching the corresponding FETs 102, 104 of the phases U, V, W as in the first measurements. Only in that way can it be ensured that the measurement error from ripple offset is the same in both measurements, and thus the symmetry of the current waviness is utilized. A further advantage of this method is that the offset error from the temperature drift is likewise automatically eliminated, since in the second measurement, it is superimposed with a reverse sign on the phase current. This can best be shown taking the current measurement in the phase U as an example. At time "$I_u$ first measurement", the FETs are switched in such a way that the shunt current corresponds to the current in phase U. Thus an offset has the same effect with the same sign as the useful signal in the outcome of measurement. In the second measurement of the phase current $I_u$ in the half-period A, the shunt current now corresponds to the current which flows out of phase U, and it thus has a negative sign. This behavior is illustrated in FIG. 5.

Figure 5:
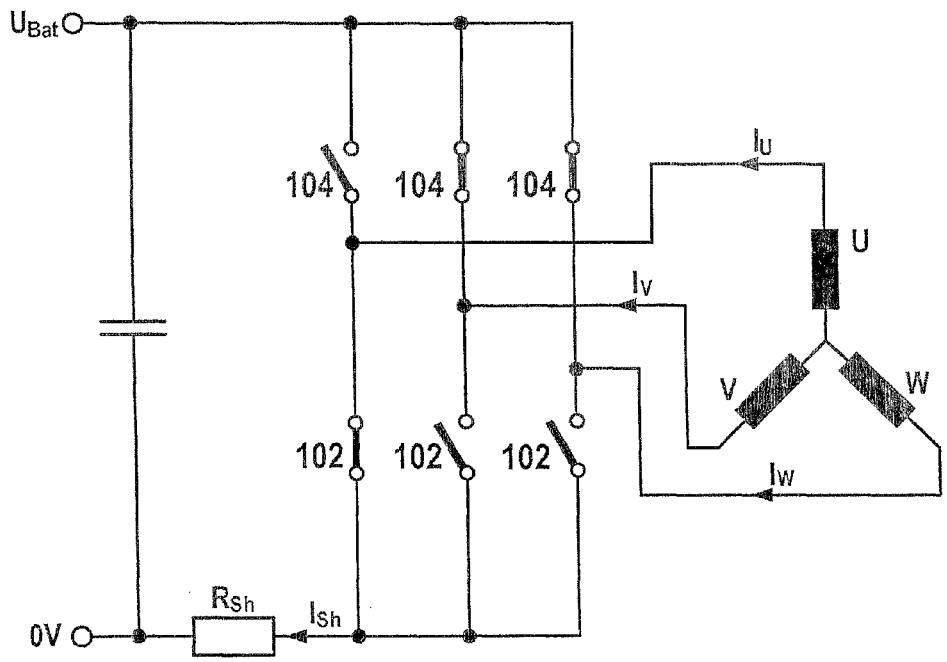
FIG. 5 shows a multiphase current network.

FIG. 5 shows a position of the B6 bridge, shown already in FIG. 1, at the time "$I_u$ second measurement", as it is shown in FIG. 4. In this exemplary embodiment, the offset enters, now with a reverse sign compared to the useful signal, into the measurement outcome and is thus cancelled out upon averaging.

Equation 2 represents this relationship again for the current in phase U:

$$I_U = (I_{U1,measurement} - I_{U2,measurement})/2 \quad (2)$$

in which for the two measurement outcomes $I_{u1,measurement}$ and $I_{u2,measurement}$, the following equations apply:

$$I_{u,first\ measurement} = I_u + \text{tripple offset} + \text{temperature offset} \quad (3)$$

and $$I_{u2,measurement} = -I_U + \text{ripple offset} + \text{temperature offset} \quad (4)$$

In the calculation of the second phase current, all that has to be taken into account is that the first measurement provides the current with a negative sign and the second measurement provides the current with a positive sign. Consequently:

$$I_w = (I_{w2,measurement} - I_{w1,measurement})/2 \quad (5)$$

in which for the two measurement outcomes $I_{w1,measurement}$ and $I_{w2,measurement}$, the following equations apply:

$$I_{w1,measurement} = -I_W + \text{ripple offset} + \text{temperature offset} \quad (6)$$

and $$I_{w2,measurement} = I_W + \text{ripple offset} + \text{temperature offset} \quad (7)$$

The method of the invention just described can be employed only with certain pulse width modulation patterns.

Figure 6:
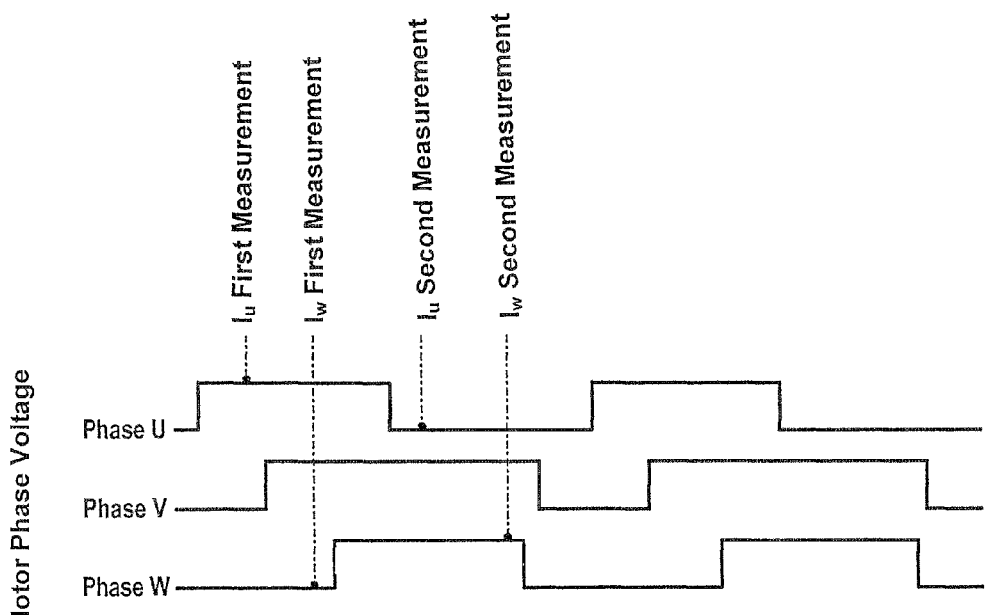
FIG. 6 shows a further switching pattern.

FIG. 6 shows a switching pattern in which a second measurement of the phase current W, and thus double sampling, are not possible. Once again, in FIG. 6, the motor voltages of the phases U, V, W and the measurements "$I_u$ first measurement", "$I_w$ first measurement", "$I_u$ second measurement", and "$I_w$ second measurement" are again shown. However, the measurement "$I_w$ second measurement" cannot be utilized, since the motor phase voltage of phase V is not inverted with respect to the state during the measurement "$I_w$ first measurement".

Even shifting the measurement time cannot make the second measurement possible here, since in the half-period A, a switching pattern can never be found that allows the current $I_w$ sought to flow long enough through the shunt that a steady-state value could be sampled at the input of the analog/digital converter of the measuring device. Since this switching pattern is more the rule than the exception in normal operation, the most recently ascertained ripple offset can be ascertained in the software and stored in memory. This is quite simple to do, by subtracting the current, ascertained with the aid of a measurement with possible double sampling, from the raw value from the first measurement of this double sampling. This value stored in memory can then be used for offset compensation, if double sampling is not possible.

The foregoing relates to the preferred exemplary embodiments of the invention, it being understood that other variants and embodiments thereof are possible within the spirit and scope of the invention, the latter being defined by the appended claims.

The invention claimed is:

1. A method for current measurement in a multiphase current network, which has the following steps:
   detecting a first current value of a current flowing between a first phase of the multiphase current network and a first voltage potential at a first detection time;
   detecting a second current value of the current flowing between the first phase and the first voltage potential, at a second detection time, and the first detection time and the second detection time are selected such that the first current value and the second current value have different signs; and
   ascertaining a current value for the current from an average of the first current value and the second current value,
   wherein detection of the first current value and the second current value is done by means of a measuring device disposed between the first voltage potential and a plurality of first switches, and each phase of the multiphase current network is connected to the measuring device via a respective one of the plurality of first switches,
   wherein the measuring device includes a shunt resistor connected between the first voltage potential and the plurality of first switches through which the current flows,
   wherein each of the first switches is electrically connected to the shunt resistor, and
   wherein the first switch connected to the first phase is the only first switch closed at the first detection time such that the current flowing through the shunt resistor corresponds to the current flowing into the first phase and the first switch connected with the first phase is the only first switch opened at the second detection time such that the current flowing through the shunt resistor corresponds to the current flowing out of the first phase.

2. The method as defined by claim 1, wherein the first detection time is separated by an interval of a first predetermined duration from a first switching event of the first switch, associated with the first phase, and the second detection time is separated by an interval of a second predetermined duration from a second switching event of the first switch associated with the first phase.

3. The method as defined by claim 2, wherein a value corresponding to the second current value is furnished from a memory, if it is not possible to detect the second current value at the second detection time.

4. The method as defined by claim 1, wherein a value corresponding to the second current value is furnished from a memory, if it is not possible to detect the second current value at the second detection time.

5. The method as defined by claim 1, wherein each phase of the multiphase current network is connected via a respective second switch to a second voltage potential, and at the first detection time, only a second switch of the first phase is opened, and at the second detection time, only the second switch of the first phase is closed.

6. An apparatus for current measurement in a multiphase current network, the apparatus comprising:
  a shunt resistor via which the multiphase current network is connected to a first voltage potential;
  a plurality of first switches for connecting the multiphase current network to the shunt resistor, wherein each phase of the multiphase current network is connected to the shunt resistor via a respective one of the plurality of first switches;
  a measuring device for detecting a first current value of a current flowing between a first phase of the multiphase current network and the first voltage potential through the shunt resistor, at a first detection time and for detecting a second current value of the current, flowing between the first phase and the first voltage potential through the shunt resistor, at a second detection time, wherein the first detection time and the second detection time are selected such that the first current value and the second current value have different signs; and
  a device for ascertaining a current value for the current from an average of the first current value and the second current value,
  wherein the first switch connected to the first phase is the only first switch closed at the first detection time and the first switch connected with the first phase is the only first switch opened at the second detection time.

* * * * *